United States Patent [19]

Jagborn

[11] Patent Number: 4,596,305

[45] Date of Patent: Jun. 24, 1986

[54] LOUDSPEAKER BOX IN THE SHAPE OF A SHELL CONSTRUCTION

[76] Inventor: Tommy K. Jagborn, Väktaregatan 5, S-301 00 Falkenberg, Sweden

[21] Appl. No.: 531,836

[22] PCT Filed: Dec. 6, 1982

[86] PCT No.: PCT/SE82/00419

§ 371 Date: Aug. 5, 1983

§ 102(e) Date: Aug. 5, 1983

[87] PCT Pub. No.: WO83/02211

PCT Pub. Date: Jun. 23, 1983

[30] Foreign Application Priority Data

Dec. 7, 1981 [SE] Sweden ................................ 8107305

[51] Int. Cl.[4] ................................................ H05K 5/00

[52] U.S. Cl. ...................................... 181/151; 181/199

[58] Field of Search ................ 181/146, 151, 198, 199, 181/291, 294; 428/71, 76, 313.3, 317.9, 319.3, 319.7

[56] References Cited

U.S. PATENT DOCUMENTS

| | | | |
|---|---|---|---|
| 3,859,401 | 1/1975 | Gallap et al. | 428/319.7 X |
| 3,956,549 | 5/1976 | Stoeberl | 428/319.3 X |
| 3,982,607 | 9/1976 | Evans | 181/152 |
| 4,013,810 | 3/1977 | Long | 428/313.9 |
| 4,079,162 | 3/1978 | Metzger | 181/286 X |
| 4,137,200 | 1/1979 | Wood et al. | 521/159 |
| 4,161,995 | 7/1979 | Pohlmann et al. | 181/150 |
| 4,340,129 | 7/1982 | Salyers | 181/291 X |
| 4,463,043 | 7/1984 | Reeves et al. | 428/76 X |
| 4,524,845 | 6/1985 | Perrigo | 181/152 |

FOREIGN PATENT DOCUMENTS

| | | | |
|---|---|---|---|
| 2321175 | 11/1973 | Fed. Rep. of Germany . | |
| 0128728 | 10/1979 | Japan | 181/167 |
| 598730 | 5/1978 | Switzerland . | |

*Primary Examiner*—Benjamin R. Fuller

*Attorney, Agent, or Firm*—Merchant, Gould, Smith, Edell, Welter and Schmidt

[57] ABSTRACT

The invention relates to a loudspeaker box designed as a shell construction, where the outer and inner peripheral surfaces of the box are made of reinforced plastic and are preferably twin-curved with a continuously varying radius of curvature, where the distance between the outer and the inner shell is not constant and where the space between the shells is filled with a light material with good adhesion to the shells, preferably foam plastic. This design principle is intended to avoid natural resonances while at the same time ensuring low weight and high strength.

6 Claims, 2 Drawing Figures

LOUDSPEAKER BOX IN THE SHAPE OF A SHELL CONSTRUCTION

BACKGROUND OF INVENTION

When designing loudspeaker boxes the predominant design principle consists in the box being built as a rectangular parallelepiped with five plane walls and a front panel for mounting the loudspeaker element. This method of construction enables the use of standard materials such as plywood panels, chipboards etc. With this design every plane surface has a natural frequency and the vibration of the surface is mechanically linked to the vibrations of the other surfaces via the joints at the edges of the box, thus resulting in a complicated pattern of natural vibrations which are felt as noise vibrations if the natural vibrations become excessive. In order to reduce this problem it is possible to fit within the loudspeaker box a lattice system directly linking the surface vibrations to one another, and the natural vibration problem can be reduced by joining in this way surfaces with different natural frequencies. It is, however, difficult, by such means to prevent natural vibrations entirely without a loudspeaker box constructed in accordance with the above principle having the characteristic that certain sound frequencies are amplified more than others thus resulting in not entirely natural sound reproduction.

The invention is based on the idea that another method of avoiding undesirable natural vibrations consists in designing the peripheral surfaces of the box as far as possible as twin-curved surfaces with each surface having a continuously varied radius of curvature. A surface designed in this manner does not possess a natural frequency in its proper sense, at any rate within the range audible to a human being. A further improvement is achieved, if the inner and outer peripheral surfaces of the loudspeaker box are not at a constant distance from one another and are mechanically linked.

Figure 1:
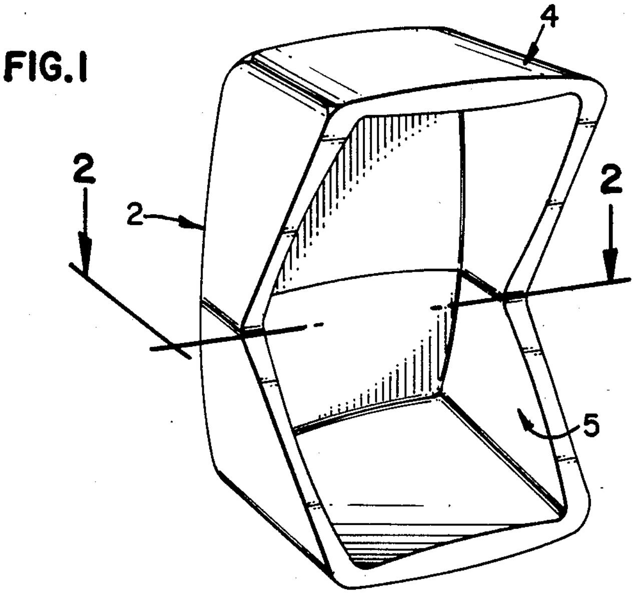
FIG. 1 is a perspective plan view of one embodiment of the loudspeaker box of the present invention.
Figure 2:
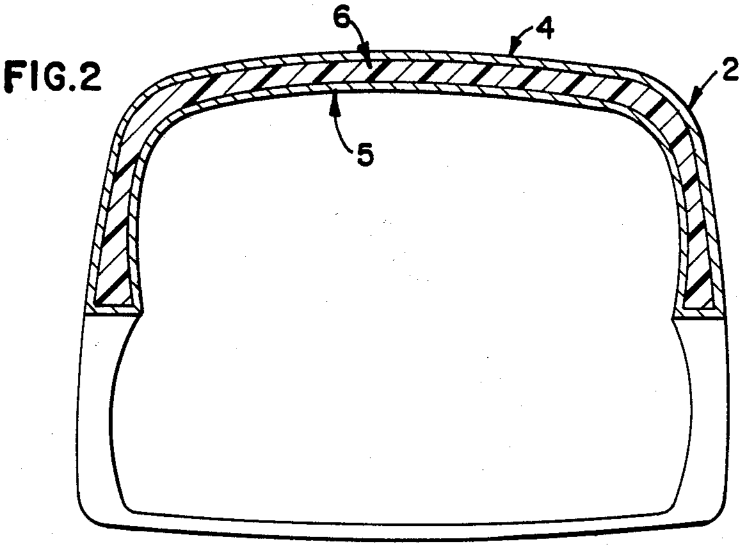
FIG. 2 is a horizontal cross-sectional view of the loudspeaker box of FIG. 1 taken generally along the lines 2—2 of FIG. 1.

So as to achieve in addition to good accoustic characteristics low weight and high strength it is advantageous to design the loudspeaker box 2 as a shell construction, the space between the outer shell 4 and the inner shell 5, being filled with a light material such as foam plastic 6 which adheres well to the shell walls. As is depicted in FIG. 2, each shell has a continuously variable radius of curvature, so that the distance between the inner and outer shells is not constant. A loudspeaker box such as described above with the shells consisting of reinforced plastic, for instance glass or carbon fibre reinforced polyester or epoxy resin, where the space between the shells ensures good acoustic characteristics with resonance-free reproduction within the entire audible range while at the same time bringing about considerably higher strength and lower weight than with the conventional construction methods where use is made of plane solid walls. The foam plastic between the shells may be produced from different materials in accordance with substantially three different principles:

1. The material consists of a condensation polymerisate, with the secondary product produced in the course of condensation consisting of a gas which causes the material to foam. Example: Polyol-isocyanate compounds giving off carbon dioxide.

2. The material consists of an addition polymerisate to which a fermenting agent is added. Example: Polyester or epoxy resin containing fermenting agent.

3. The material consists of a so-called syntactic foam i.e. a polymerisate of addition type mixed with low-density micro-spheres. Example: Polyester or epoxy resin mixed with micro-balloons of glass.

4. The material consists of a combination of two or more of the above principles. Example: Polyurethane foam containing glass micro-balloons.

I claim:

1. A loudspeaker box comprising an inner plastic shell and an outer plastic shell, said shells being twin-curved, said shells being maintained in a spaced relationship wherein the radius of curvature of said shells is continuously varied so that the distance between the outer and inner shells is not constant, and being linked by a plastic foam material which adheres to the inner and outer shells and fills the space between them.

2. The loudspeaker box in accordance with claim 1 wherein the shells are made of polyester or epoxy resin, wherein said resin is reinforced with glass or carbon fibers.

3. A loudspeaker box comprising an inner plastic shell and an outer plastic shell, said shells being maintained in a spaced relationship so that the distance between the outer and inner shells is not constant, and being linked by a plastic foam material which adheres to the inner and outer shells and fills the space between them, wherein the foam material within the shells of the box consists of a condensation polymer, wherein a gaseous substance which causes the material to foam is formed in the course of the condensation.

4. A loudspeaker box comprising an inner plastic shell and an outer plastic shell, said shells being maintained in a spaced relationship so that the distance between the outer and inner shells is not constant, and being linked by a plastic foam material which adheres to the inner and outer shells and fills the space between them, wherein the foam material within the shells of the box consists of an addition polymer to which a fermenting agent is added.

5. A loudspeaker box comprising an inner plastic shell and an outer plastic shell, said shells being maintained in a spaced relationship so that the distance between the outer and inner shells is not constant, and being linked by a plastic foam material which adheres to the inner and outer shells and fills the space between them, wherein the foam material within the shells of the box consists of a syntactic foam.

6. A loudspeaker box comprising an inner plastic shell and an outer plastic shell, said shells being maintained in a spaced relationship so that the distance between the outer and inner shells is not constant, and being linked by a plastic foam material which adheres to the inner and outer shells and fills the space between them, wherein the foam material within the walls of the box consists of a condensation polymer, wherein a gaseous substance which causes the material to foam is formed in the course of the condensation; an addition polymer to which a fermenting agent is added; or a syntactic foam.

* * * * *